US006872498B2

(12) United States Patent
Nagasaka et al.

(10) Patent No.: US 6,872,498 B2
(45) Date of Patent: Mar. 29, 2005

(54) PATTERN DRAWING DEVICE AND MANUFACTURING METHOD OF PATTERN DRAWING BODY

(75) Inventors: Kimio Nagasaka, Suwa (JP); Akira Miyamae, Suwa (JP); Eiichi Fujii, Suwa (JP)

(73) Assignee: Seiko Epson Corporation (JP)

( * ) Notice: Subject to any disclaimer, the term of this patent is extended or adjusted under 35 U.S.C. 154(b) by 189 days.

(21) Appl. No.: 10/197,640

(22) Filed: Jul. 17, 2002

(65) Prior Publication Data

US 2003/0020800 A1 Jan. 30, 2003

(30) Foreign Application Priority Data

Jul. 17, 2001 (JP) .................................... 2001-217152

(51) Int. Cl.$^7$ ............................ G03F 9/00; B41J 2/435; B41J 27/00

(52) U.S. Cl. ........................... 430/22; 430/30; 347/249; 347/258; 716/19; 716/20

(58) Field of Search ..................... 430/22, 30; 347/249, 347/258; 716/19, 20

(56) References Cited

FOREIGN PATENT DOCUMENTS

| | | |
|---|---|---|
| JP | 59-171119 | 9/1984 |
| JP | 10-011814 | 1/1998 |

*Primary Examiner*—Christopher G. Young
(74) *Attorney, Agent, or Firm*—Harness, Dickey & Pierce, P.L.C.

(57) ABSTRACT

The present invention provides a pattern drawing device that enables drawing with reduced operational processing loading of the associated CPU. Thus, in a pattern drawing device for forming a plurality of tracks disposed concentrically on a substrate to produce a two-dimensional pattern, a basic pixel sequence is prepared and used repeatedly in forward (positive) and/or reverse (negative) order to produce symmetric portions of the two-dimensional pattern.

16 Claims, 14 Drawing Sheets

PATTERN DRAWING DEVICE AND MANUFACTURING METHOD OF PATTERN DRAWING BODY

BACKGROUND OF THE INVENTION

1. Field of the Invention

The present invention relates to a pattern drawing device for forming minute patterns on thin films such as those formed on substrates during the process of manufacturing integrated circuits, display devices, optical devices and other such devices.

2. Description of the Related Art

Thin film patterning steps are essential in the manufacture semiconductor substrates, optical devices and other such devices. Patterning, for example, is performed by applying a photo resist layer on the thin film to be processed, exposing a pattern on such photo resist, developing the exposed photo resist to form a resist pattern, and etching thin film using the resist pattern as an etch mask. A pattern drawing device is used for exposing the pattern on the photo resist, typically through the use of a photo mask or utilizing an exposure method employing an optical beam scanning technique. The latter is used in the preparation of an optical disk original and drawing of free patterns. For instance, Japanese Patent Laid-Open Publication No. S59-171119 and Japanese Patent Laid Open Publication No. H10-11814 describe a pattern drawing device employing a rotational scanning system. These pattern drawing devices mount a substrate coated with photo resist on a turntable, and draw patterns on the substrate by performing rotational scanning with a laser beam modulated with pattern data.

Nevertheless, with the aforementioned pattern drawing devices employing the rotational scanning system, the original pattern data read by the X-Y coordinate system with a device such as a scanner and saved as a stored pattern is converted into an r-θ coordinate system, and this r-θ pixel data is temporarily stored in the memory. The pixel data is then read from the memory in synchronization with the substrate rotation and used to modulate the optical beam so as to draw a pattern by selectively exposing the photo resist. Thus, data for the r-θ coordinate system must be converted each time the stored pattern to be drawn is rotationally scanned at least once (1 track worth). When it is necessary to draw a high-resolution pattern, because data must be converted from an X-Y coordinate system to the r-θ coordinate system for all drawing points on the circumference of each track, the operational load increases, and the conversion time expands, thereby restricting high-speed drawing. Moreover, when the processing performance of the CPU is relatively low, drawing of high-resolution or multi-valued patterns is restricted and a larger CPU capacity and/or larger memory will be required for adequate performance.

SUMMARY OF THE INVENTION

Accordingly, an object of the present invention is to provide a pattern drawing device capable of high-speed drawing even without improved CPU processing performance.

Another object of the present invention is to provide a pattern drawing device capable of high-resolution drawing even without CPU processing performance.

In order to achieve the foregoing objects, the pattern drawing device according to the present invention is capable of forming a plurality of tracks disposed concentrically on a substrate to thereby form a two-dimensional pattern, comprising: pattern generation means for repeatedly arranging, in positive or reverse, a basic pixel sequence to be the basis for each track at least in two places on one track and, by performing this pattern generation in a plurality of consecutive tracks, forming the two-dimensional pattern; modulation means for modulating a drawing beam scanning the substrate according to the pixel sequence data; and beam position setting means for synchronizing with the pixel sequence data and setting the scanning position of the drawing beam on the substrate.

According to the foregoing structure, patterns may be drawn while reducing the need to convert pixel data from the X-Y coordinate system to the r-θ coordinate system.

Preferably, the substrate is demarcated with a plurality of sector areas divided in the circumferential direction and cluster areas that combine one or more consecutive sector areas to form a plurality of cluster areas; and the pattern generation means outputs the basic pixel sequence as the drawing beam scans a track within a cluster area.

According to the foregoing structure, the control program of the overall pattern formation is simplified.

Preferably, the pattern generation means arranges a simulated pixel sequence which does not form a pattern between the basic pixel sequence. This will alleviate the operational load of the drawing processing since the conversion of pattern data is no longer required.

Preferably, the pattern generation means arranges a simulated pixel sequence which does not form a pattern on the track of the sector area other than the cluster area. This will simplify the pattern forming program since the setting of drawing in sector units is enabled.

Preferably, the track is a locus obtained by rotationally scanning the substrate with a drawing beam modulated with the pixel sequence data. For instance, pattern drawing using optical beams and light-sensitive films can be easily conducted.

The manufacturing method of a pattern drawing body according to the present invention comprises forming a plurality of tracks disposed concentrically on a substrate and drawing a two-dimensional pattern; wherein the two-dimensional pattern is formed by repeatedly arranging, in positive or reverse, a basic pixel sequence to be the basis for each track at least in two places on one track and, by performing this operation on a plurality of consecutive tracks, to form the two-dimensional pattern.

Preferably, the foregoing manufacturing method comprises the steps of: demarcating the substrate with a plurality of sector areas divided in the circumferential direction and a cluster area combined with one or a plurality of consecutive sector areas; including a plurality of cluster areas in the substrate; and arranging the basic pixel sequence on the track of the cluster area.

Preferably, a simulated pixel sequence is arranged which does not form a pattern on the track of the sector area other than the cluster area.

Moreover, the manufacturing method of a device comprising the pattern drawing body according to the present invention is capable of producing a pattern drawing body according to any one of the methods of manufacturing a pattern drawing body described above.

The foregoing pattern drawing device and drawing method may be employed in semiconductor devices comprising integrated circuits, LCD display devices, electrophoretic display devices and other display devices, as well as optical devices such as photo masks, light reflectors, optical waveguides, diffraction gratings among others, and devices comprising such pattern drawing bodies.

DESCRIPTION OF THE PREFERRED EMBODIMENTS

Figure 1:
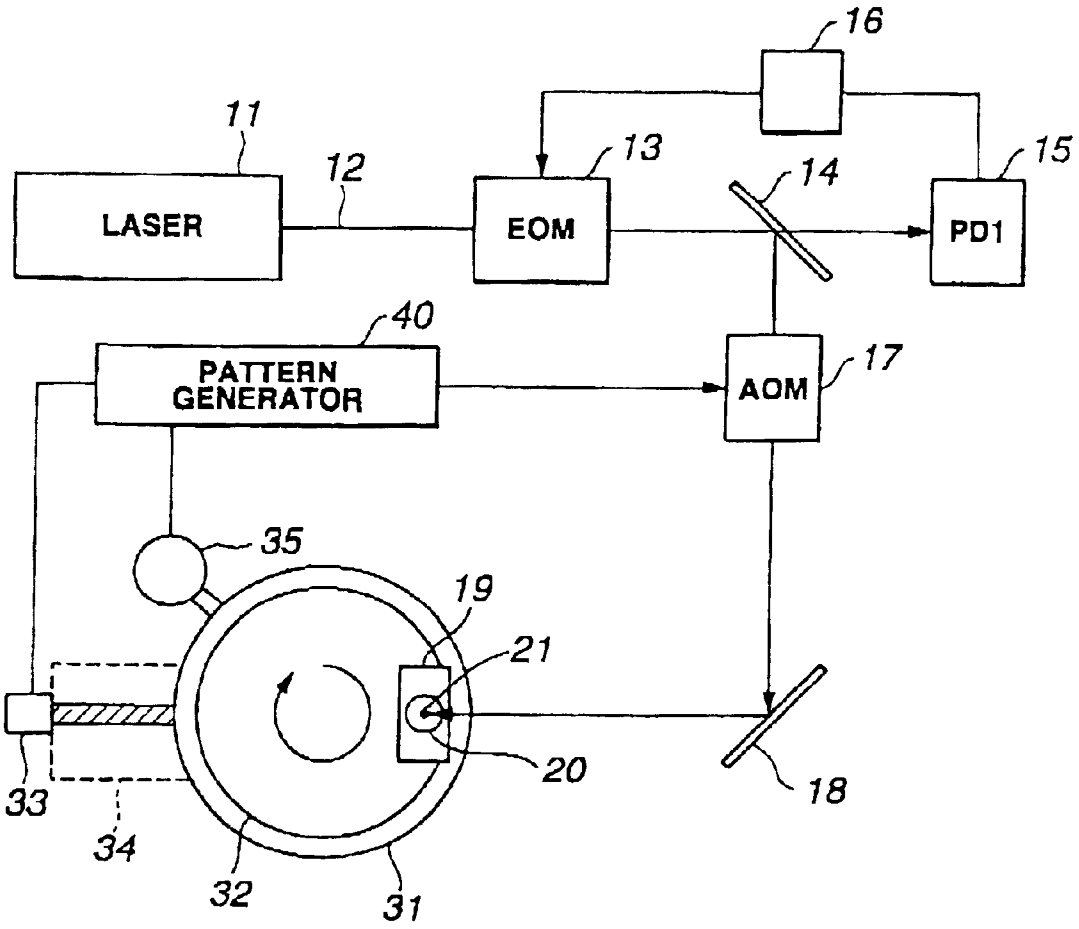
FIG. 1 is a functional block diagram illustrating the overall structure of the pattern drawing device according to the present invention.

In FIG. 1, the optical beam (laser beam) 12 emitted from the laser beam generation device 11, which functions as the optical beam light source, arrives at the half mirror 14 via the electro-optic modulator (EOM) 13. A part of the optical beam 12 passes through the half mirror 14 and enters the first optical detector 15, and the remainder enters the acousto-optical modulator (AOM) 17. The optical detector 15 detects the intensity of the optical beam 12. The detected optical intensity is converted into a level signal, and supplied from the optical detector 15 to the level adjuster 16. The level adjuster 16 sets the transmittance and adjusts the intensity of the optical beam by controlling the control signal to be applied to the electro-optic modulator 13 in accordance with the position r in the diameter direction of the turntable 31 of the optical beam spot 21. Thus, when rotational control of the turntable 31 is conducted to provide a constant angular velocity (CAV), the exposure energy density of a steady optical beam scanning the photo resist will be uniform across the face of the substrate. The electro-optic modulator 13, first optical detector 15, level adjuster 16 comprise the level adjustment loop.

The optical beam 12 reflected off the half mirror 14 is adjusted to a prescribed intensity using the level adjustment loop, and is delivered to the turntable 31 via the acousto-optical modulator (AOM) 17, reflection mirror 18, reflection mirror 19 and objective lens 20. The acousto-optical modulator 17 modulates the intensity of the optical beam 12 by changing the transmittance in accordance with the pattern signal supplied from the pattern generator 40 (described in more detail below). The acousto-optical modulator 17 corresponds to the modulation means for modulating the drawing beam with the pixel sequence data. The objective lens 20 condenses the optical beam 12 on the substrate 32, and forms a light spot 21. The light spot 21 is controlled to provide a constant diameter (or focal depth) with a focus servo (not shown). The skew method, for example, may be employed as the focus servo. Moreover, when a plurality of laminated films are formed on the substrate, it is also possible to adjust the focus onto a specific film among such a plurality of laminated films. The diameter of the light spot 21 corresponds to the width in the diameter direction of one rotational scan (width of one track), and is used for writing (drawing) the pattern.

The spindle motor 35 rotatably drives the turntable 31 on which the substrate 32 is mounted. This rotation is controlled with a drive circuit (not shown) that generates a drive signal in accordance with the clock signal supplied from the pattern generator 40. Moreover, the turntable 31 is mounted on a slider 34 which moves in the diameter direction thereof, with slider 34 being driven with a forwarding motor 33. A single rotation of the turntable indexes the slider one pitch, and a spiral, rotational scanning locus can be obtained with the light spot 21 thereby. The forwarding amount of the forwarding motor 33 is controlled by the pattern generator 40. Here, the turntable 31, forwarding motor 33, slider 34 and spindle motor 35 comprise a beam position setting means for setting the scanning position of the drawing beam on the substrate by synchronizing with the pixel sequence data. An alternative method of setting the beam position would be moving the imaging optics (18 to 21) along a diameter direction of a fixed turntable.

Figure 2:
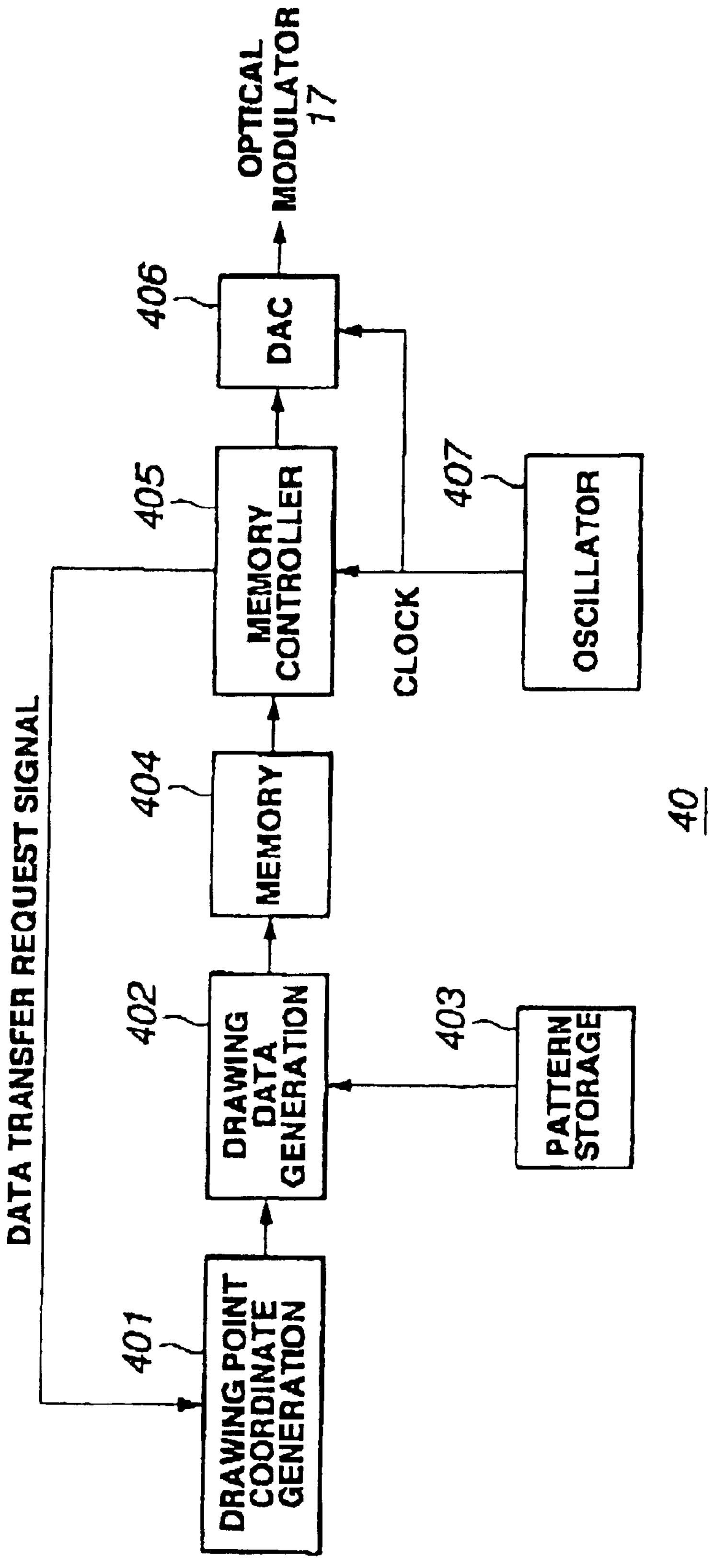
FIG. 2 is a block diagram illustrating a structural example of the pattern generator 40.

As illustrated in FIG. 2, the pattern generator 40 comprises a drawing point coordinate generation unit 401, a drawing point coordinate data generation unit 402, a pattern storage unit 403, a memory 404, a memory controller 405, a D/A converter 406 and an oscillator 407. These various functions may be realized with a computer system.

The drawing point coordinate generation unit 401 outputs the address of each pixel of the track to be drawn in a polar coordinate ($r_1$, $\theta_1$) format corresponding to the turntable in accordance with the data transfer request signal supplied from the memory controller 405. For instance, one track worth of a pixel address group is consecutively generated. The drawing data generation unit 402 coverts the address of each pixel ($r_1$, $\theta_1$) represented with polar coordinates into the pattern data address of the position ($x_i$, $y_1$) of the corresponding X-Y coordinate system. The coordinate conversion of polar coordinates ($r_i$, $\theta_i$) and X-Y coordinates ($x_1$, $y_1$) can be conducted with the relational expression of $x_1=r_1\cos\theta_1$, $y_1=r_1\sin\theta_1$. Here, $r_i$ is the distance OP (corresponds to track number $r_i$) from the original point position O (0, 0) of the X-Y coordinates to the pixel of an arbitrary position P ($x_i$, $y_i$), and $\theta_i$ is the angle formed between the X axis and the segment OP. Data corresponding to the pattern to be drawn on the substrate may, for example, be retained beforehand in the pattern storage unit 403 as two-dimensional bitmap data obtained from a device such as a scanner. Moreover, this stored pattern data may also be converted CAD data (pattern design data by a computer) or the like. The storage unit 403 also stores information relating to the formation of the pattern to be drawn. This information is provided to the memory controller 405 via the memory 404. The drawing data generation unit 402 reads the pixel data of the pattern to be drawn from the pattern storage device 403 with the X-Y coordinate system address ($x_1$, $y_1$) corresponding to the series of polar coordinate addresses ($r_1$, $\theta_1$) supplied from the drawing point coordinate generation unit 401 described above, and stores this in the memory 404. For instance, one track worth of pixel data may be stored in the memory 404.

Figure 3:
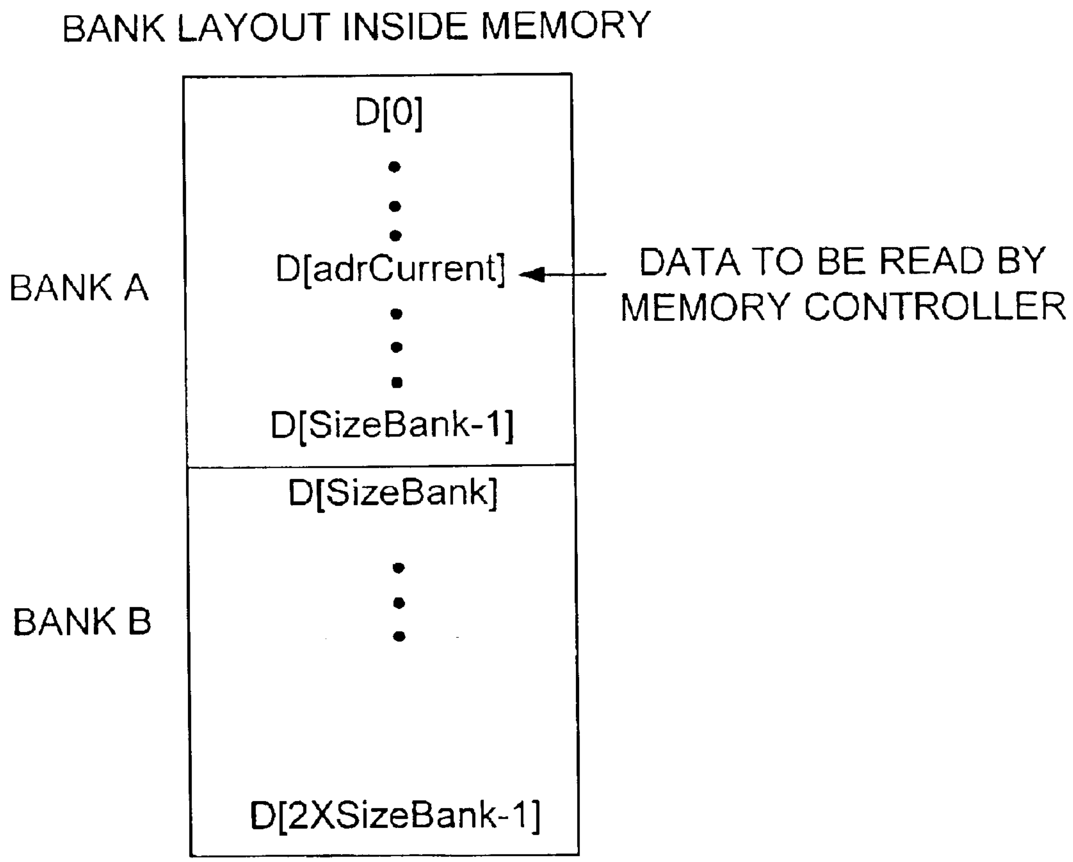
FIG. 3 is a diagram illustrating a usage example of the internal area of the memory 404.

As shown in FIG. 3, the memory 404, for example, comprises two independent memory areas, bank A and bank B, so that while one bank is being read or written, it is possible to read from or write to the other bank. Bank A is assigned the areas of memory addresses [0] to [SizeBank−1], and bank B is assigned the areas of memory addresses [SizeBank] to [2×SizeBank−1]. Data of bank B is renewed while the data D of the address, which is the current read-out address of bank A, is being read by the memory controller 405. Therefore, while the pixel data group of the first track is being read, it is possible to write the pixel data group for the subsequent track into the other bank, thereby enabling the FIFO (First In First Out) operation.

The memory controller 405 sequentially reads the pixel data of each track from the memory 404 and supplies this data to the D/A converter 406 to produce the modulation input for the acousto-optical modulator 17. The optical beam is then modulated by setting the transmittance of the acousto-optical modulator 17 in accordance with the pixel data.

When the memory controller 405 finishes reading one track worth of pixel data from one of the banks of the memory 404, it begins reading the pixel data of the subsequent track from the other bank and simultaneously outputs a data transfer request signal to the drawing point coordinate generation unit 401 to begin loading the pixel data address of the next subsequent track. When this sequence is repeated, the drawing point coordinate generation unit 401 sequentially generates the pixel data address for each track from the first track to the final track, to provide the pixel data address for the full area of the substrate onto which the pattern is to be drawn. The memory controller 405 and D/A converter 406 supplying the pixel data operate in synchronization with the clock signal supplied from the oscillator 407, and the clock output from this oscillator 407 also being used to control the rotation of the spindle motor 35 and the position of the forwarding motor 33. This allows rotation of the turntable 31 and the diameter direction movement of the slider 34 to be synchronized with the forwarding of the pixel data. Therefore, the respective control systems of the turntable 31 and slider 34 are synchronized with the forwarding of the pixel data to draw a pattern during the rotational scanning of the r-θ system coordinates.

In the embodiments of the present invention, in order to reduce the operational processing load of the foregoing coordinate conversion in the drawing point coordinate generation or drawing data generation operations, the pattern generator 40 additionally comprises the functions of repeatedly using the data stored in the memory and generating zero data for any non-drawing area(s).

Figure 4:
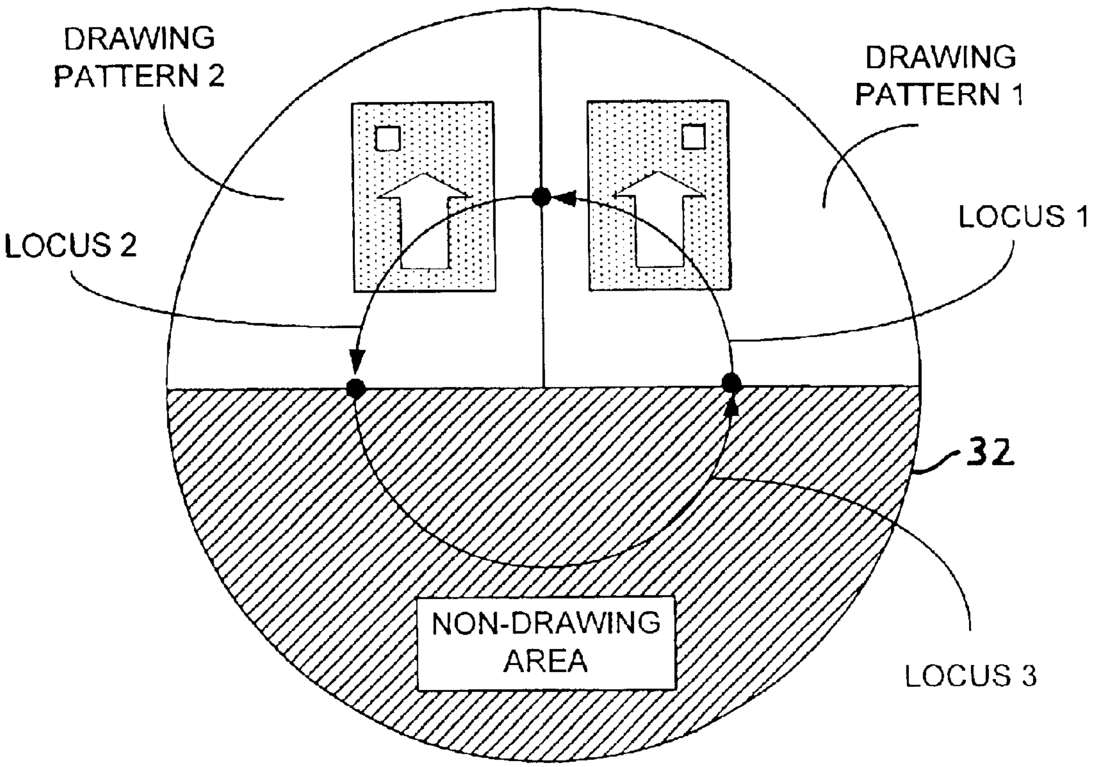
FIG. 4 is a diagram illustrating a drawing example of the first pattern.

FIG. 4 illustrates an example of a pattern to be drawn on the substrate 32 in the embodiments of the present invention. This pattern comprises a drawing pattern 1 drawn in the right half area on the upper side from the center of the circular substrate 32, a drawing pattern 2 drawn in the left half area on the upper side of the substrate, and a non-drawing area in the lower half area of the substrate. Drawing patterns 1 and 2 are figures axisymmetrical to the line passing through the center of the substrate and dividing the upper half as illustrated by the arrows drawn in the squares of drawing patterns 1 and 2. Moreover, in FIG. 4, the scanning locus forming drawing pattern 1 is shown as locus 1, the scanning locus forming drawing pattern 2 is shown as locus 2, and the locus scanning the non-drawing area is shown is locus 3.

The operation of the pattern generator, which draws this type of pattern, is now explained. As described above, the memory 404 includes the two memory banks, bank A and bank B, and SizeBank is the storage capacity (size) of the respective banks. Each of the two banks should have sufficient memory to hold the basic pixel sequence necessary to draw the longest locus within any cluster. Data of address [adrcrrnt] is represented with D [adrCrrnt].

Figure 5:
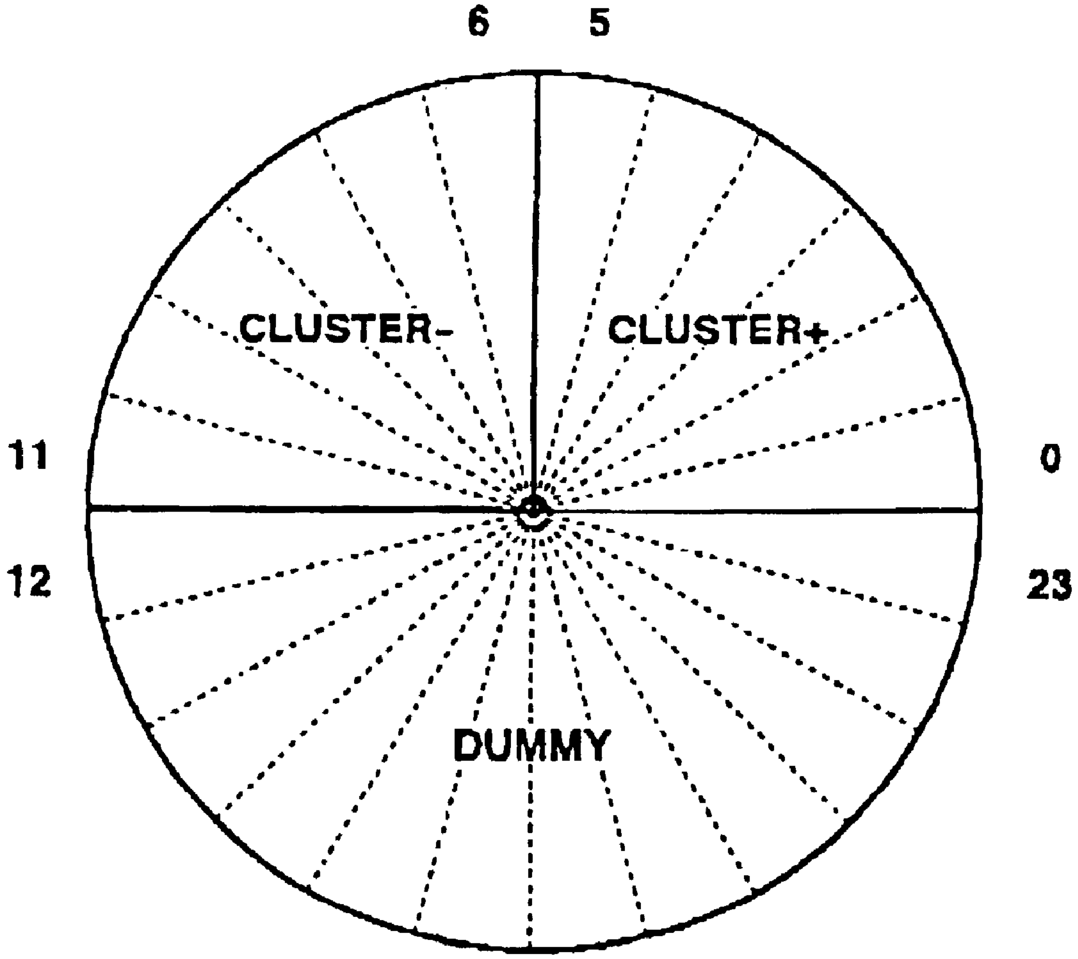
FIG. 5 is a diagram illustrating a structural example of the sector and cluster upon drawing the first pattern.

As shown in FIG. 5, the pattern generator 40 performs processing by dividing the drawing area into fan-shaped area sectors of uniform size. In this example, a full circle of the scanning locus (1 track) is divided into 24 sectors. The number of sectors is appropriately selected in accordance with the drawing pattern. One or more consecutive sectors are grouped to define a cluster. In the illustrated example, cluster+ (sectors 0 to 5), cluster− (sectors 6 to 11) and the dummy cluster (sectors 12 to 23) are respectively assigned as sectors corresponding to drawing pattern 1, drawing pattern 2, and the non-drawing area. With cluster+, the memory address is scanned in the forward direction in correspondence with drawing pattern 1 to draw a basic pixel sequence on the substrate. With cluster−, the memory address is scanned in the reverse direction in correspondence with drawing pattern 2 to draw a basic pixel sequence in an opposite arrangement on the substrate. The number of pixels in cluster+ and cluster− is the same. With the non-drawing area, the addresses do not change and a simulated (zero) data is generated.

Figure 7:
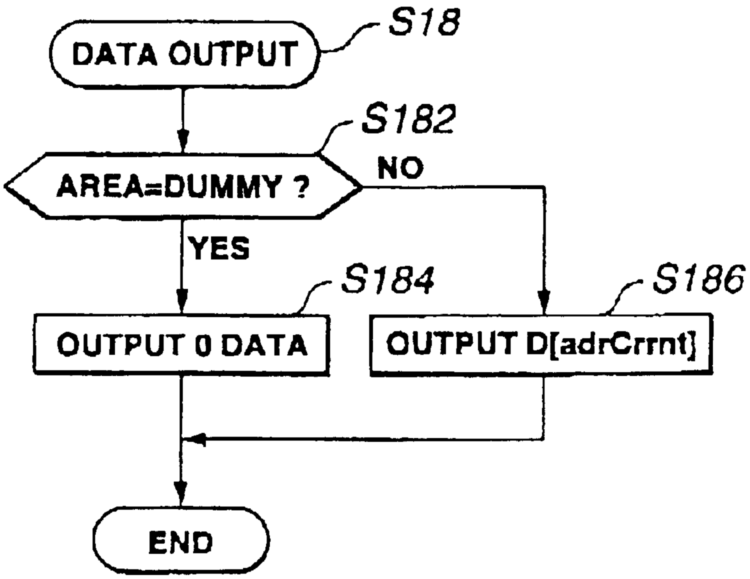
FIG. 7 is a flowchart illustrating the data output processing according to the present invention.
Figure 8:
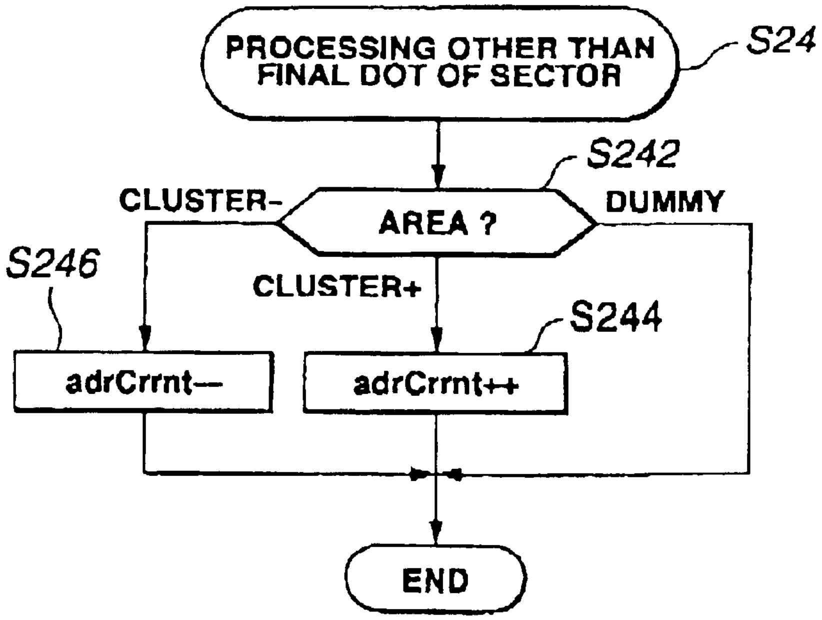
FIG. 8 is a flowchart illustrating the processing other than the final dot of the sector.
Figure 9:
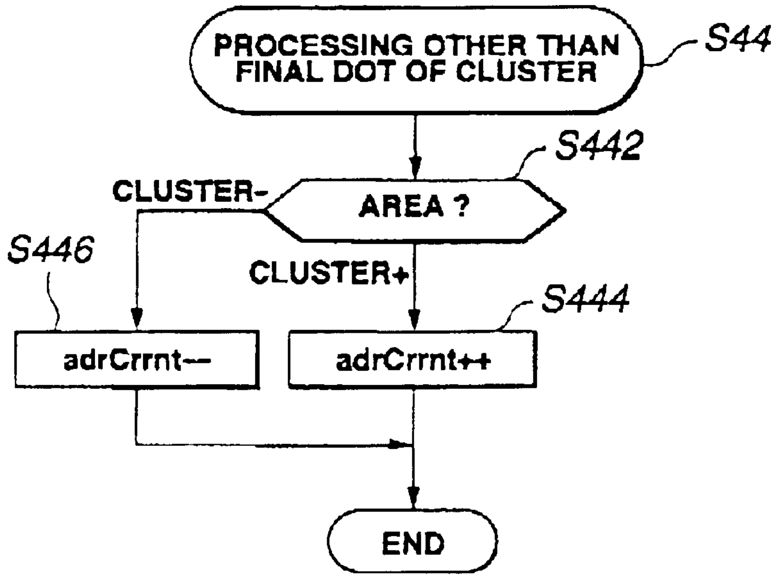
FIG. 9 is a flowchart illustrating the processing other than the final dot of the cluster.
Figure 10:
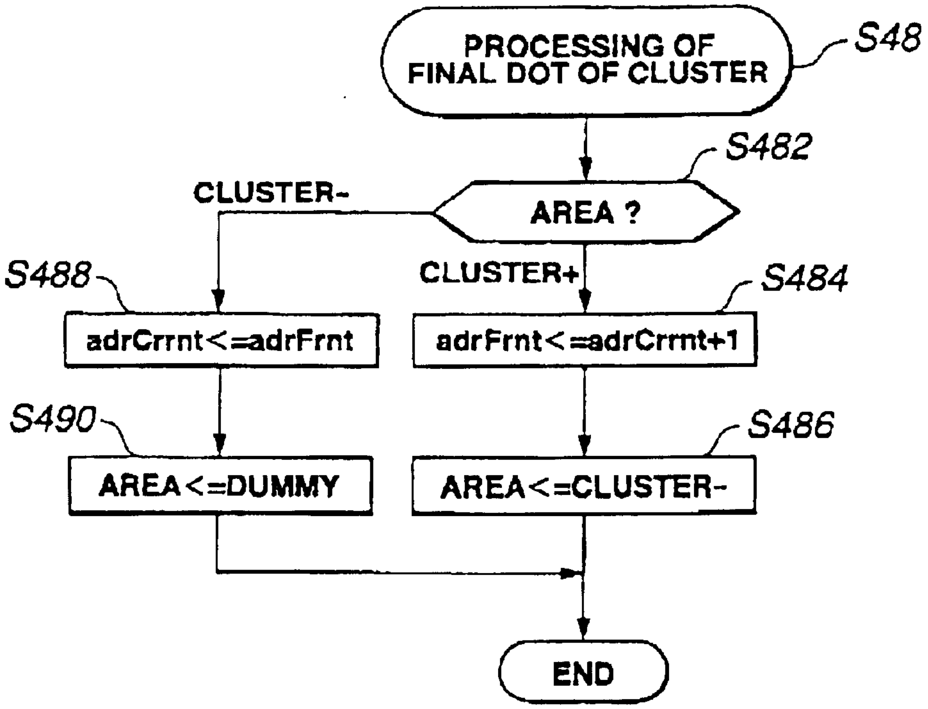
FIG. 10 is a flowchart illustrating the processing other than the final dot of the cluster.
Figure 11:
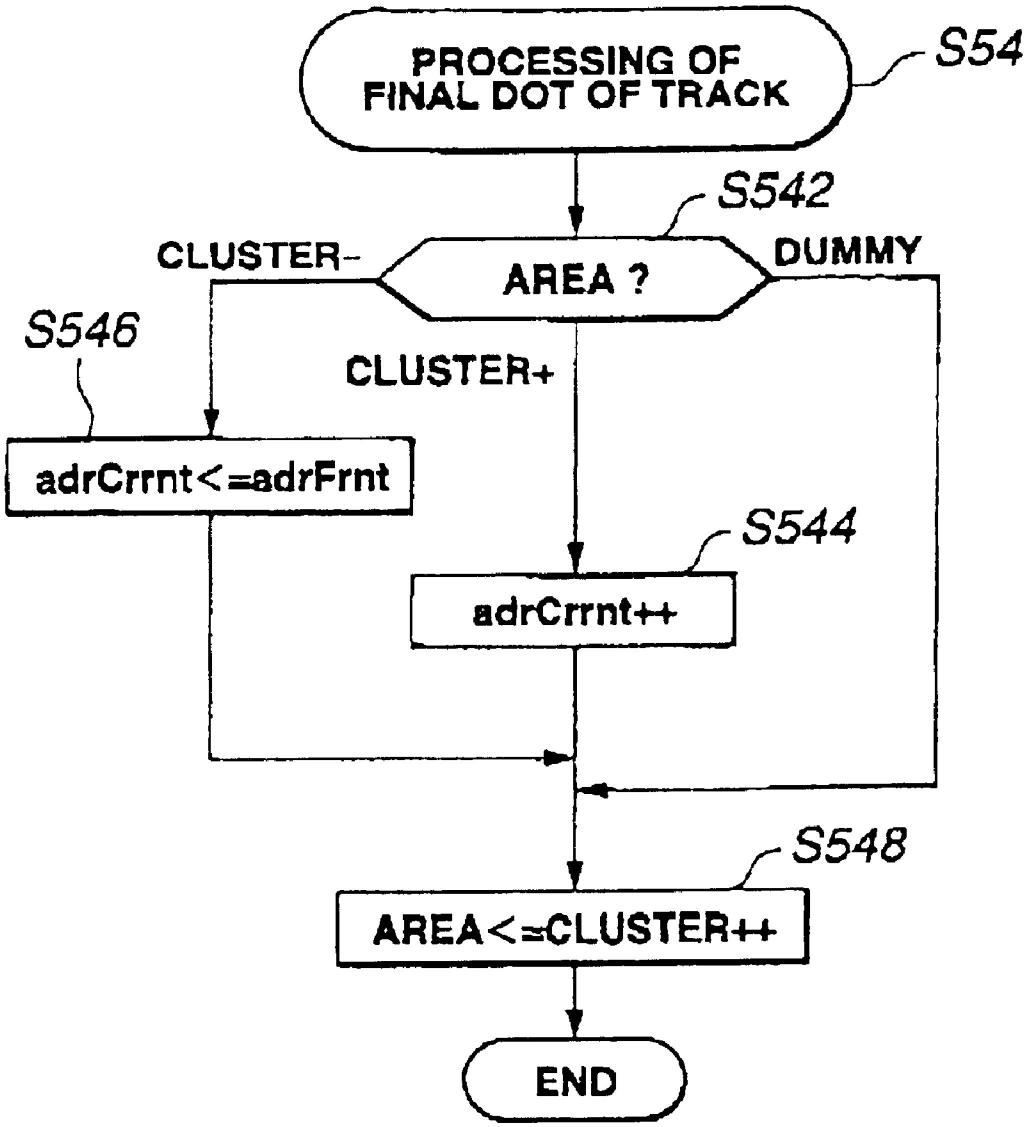
FIG. 11 is a flowchart illustrating the processing other than the final dot of the track.

The processing of the memory controller 405 in the foregoing case is now explained with reference to the flowchart provided in FIG. 6 that illustrates the main routine of the memory controller 405. FIG. 7 is a flowchart showing the data output subroutine, and FIG. 8 is a flowchart showing the subroutine for performing the dot (pixel) processing other than the sectors. FIG. 9 is a flowchart for explaining the subroutine of the final dot processing of the track. FIG. 10 is a flowchart for explaining the subroutine of the final dot processing of the cluster. FIG. 11 is a flowchart for explaining the subroutine of the final dot processing other than the clusters.

The operator, variable, and constant used in the respective flowcharts are defined as follows. The foregoing variable and the like are renewed as needed with a computer which monitors the operational mode of the device.

<=: Substitution from right side to left side

++: Increment

−−: Decrement

=?: Comparison cntDot_Sect: Variable indicating which number dot is to be processed within the sector (and within one track).

cntSect_Rev: Variable indicating which number sector is to be processed within the sector.

cntSect_Clst: Variable indicating which number sector is to be processed within the cluster.

cntTrack: Variable indicating which number track is to be processed within the drawing area.

adrCrrnt: Address for the memory controller to access the memory.

NDot_Clst: Number of dots structuring one sector on one track.

NSect_Rev: Number of sectors structuring one track; 24 in this example.

NSect_Clst: Number of sectors structuring one cluster; 6 in this example.

adrFrnt: Address corresponding to the top dot of the subsequent cluster+.

Variable adrCrrnt circulates at size 2×SizeBank. In other words, when adrCrrnt=2×SizeBank−1 and adrCrrnt is increased, adrCrrnt=0. Contrarily, when adrCrrnt=0 and adrCrrnt is decremented, adrCrrnt=2×SizeBank−1.

Figure 6:
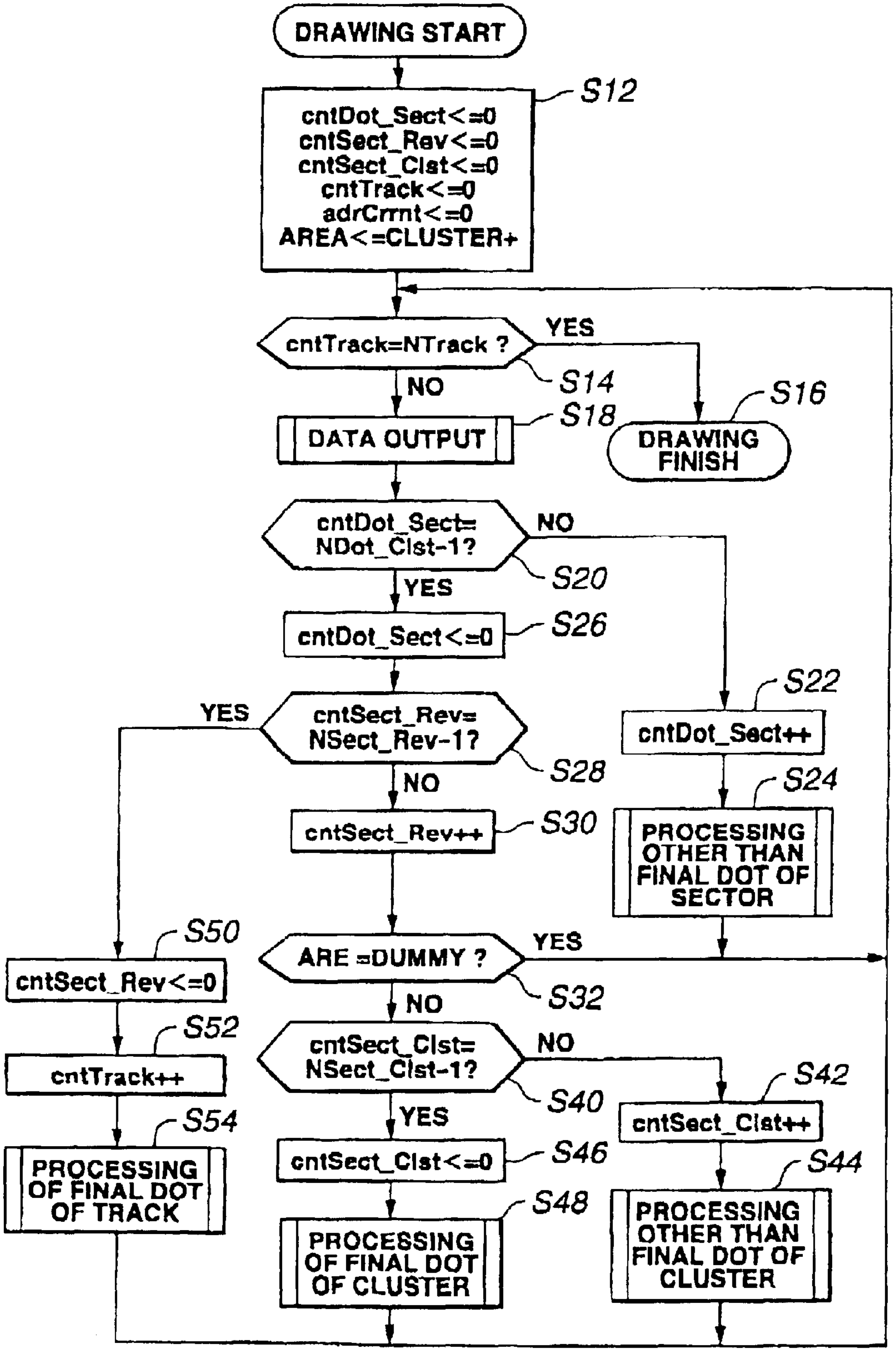
FIG. 6 is a flowchart illustrating the data-reading operation of the memory controller 405 from the memory 404.

As shown in FIG. 6, the memory controller performs initialization when drawing start is ordered. That is, variables cntDot_Sect, cntSelect_Rev, cntSect_Clst, cntTrack, and adrCrrnt are respectively set to 0. Moreover, cluster+ is selected as the drawing area, and a corresponding flag is set in the drawing area (S12).

Next, whether the track number currently being drawn has reached the track number of drawing finish is determined by checking whether the value of the variable cntTrack has reached the final value NTrack indicating the completion of the drawing track (S14). When corresponding to the completion of the drawing track (S14; Yes), the drawing processing is finished (S16).

In the initialized state, since this does not correspond to the completion of the final drawing track (S14; No), pixel data stored in the memory 404 is output (S18). Whether the processing dot number of the current sector is the final dot number of such sector is determined by checking whether the variable cntDot_Sect is equivalent to NDot_Clst-1. Moreover, since a variable starts from "0", the final dot number will be NDot_Clst-1 (S20). When the final dot of the sector has not been reached (S20; No), the read-out number of the sector is increased by "1" (S22), and processing other than the final dot of the sector is performed (S24).

As shown in FIG. 8, the processing for dots other than the final dot of the sector determines whether the current drawing area is in the dummy area, cluster+ area or cluster− area (S242). When in the dummy area, this subroutine is ended and the routine returns to step S14. When in the cluster+ area, the address for accessing the memory 404 is increased by "1" (S244), and the routine returns to step S14. When in the cluster−, the address for accessing the memory 404 is decremented by "1" (S246), and the routine returns to step S14 and repeats the processing procedures.

When the processing dot number of the sector is the final dot number of such sector (S20; Yes), the variable cntDot_Sect, which indicates the sector dot number, is set (reset) to "0" (S20) in correspondence with the movement of the drawing point to the subsequent sector.

Next, whether the sector number is the final sector number of the track is determined by comparing the variable cntSect_Rev and the variable NSect_Rev-1 (S28). Moreover, when it is not the final sector (S28; No), the variable cntSect_Rev is increased, and the sector number is increased by "1" (S30).

Whether the area of the current drawing point is the dummy area is determined (S32). When in the dummy area (S32; Yes), as described below, "0" data is output, and, without reading from the memory 404, the routine returns to step S14 and repeats the processing procedures from that point.

When not in the dummy area (S32; No), whether the sector of the current drawing point is the final sector within the relevant cluster is determined by comparing the variable cntSect_Clst and the variable NSect_Clst-1 (S40). When it is not the final sector (S40; No), this implies the final dot of the sector (S20; Yes), the variable cntSect_Clst is increased by "1" (S42), and processing other than the final dot of the cluster is performed (S44).

As shown in FIG. 9, the processing other than the final dot of the cluster determines whether the current drawing area is in the cluster+ area or cluster− area (S442). When in the cluster+ area, the address for accessing the memory 404 is increased by "1" (S444), and the routine returns to step S14. When in the cluster− area, the address for accessing the memory 404 is decremented by "1" (S446), and the routine returns to step S14 and repeats the processing procedures.

Next, when the sector of the current drawing point is the final sector within the relevant cluster (S40; Yes), "0" is set to the variable cntSect_Clst in order to reset the count (S42). Processing of the final dot of the cluster is then performed (S44).

As shown in FIG. 10, the processing of the final dot of the cluster determines whether the current drawing area is in the cluster+ area or the cluster− area (S442). When in the cluster+ area, an address in which "1" is added to the address adrCrrnt for accessing the current memory 404 as the address AdrFrnt of the top dot of the subsequent cluster is set (S484). An area flag is set to the cluster (S486), and the routine returns to step S14. When the current drawing area is in the cluster, the variable adrFmt is set to the variable adrCrrnt (S488). An area flag is set to the dummy (S490), and the routine returns to step S14 and repeats the processing procedures.

Next, when it is the final sector of the track (S28; Yes), "0" is set to the variable cntSect_Rev, the sector number is reset (S50), the variable cntTrack is increased by "1", and the processing track is set to the subsequent track (S52). The final dot processing of the track is then performed (S54).

As shown in FIG. 11, the final dot processing of the track determines whether the current drawing area is in the dummy area, cluster+ area or cluster− area (S542). When in the dummy area, cluster+ is set to the area flag (S548), and the routine returns to step S14 and repeats the processing procedures.

When the current area is in the cluster+ area, "1" is added to the variable adrCrrnt, the access address of the memory is increased (S544), cluster+ is set to the area flag (S548), and the routine returns to step S14 and repeats the processing procedures.

When the current area is in the cluster− area, the variable AdrFmt is set to the variable adrCrrnt (S546), cluster+ is set to the area flag (S548), and the routine returns to step S14 and repeats the processing procedures.

The foregoing procedures are repeated from step 14 and address designation of the memory 404 is conducted in order to read data repeatedly.

As described above, the memory controller 405 designates the address of the memory 404, reads dot (pixel) data, and draws the pattern.

Figure 12:
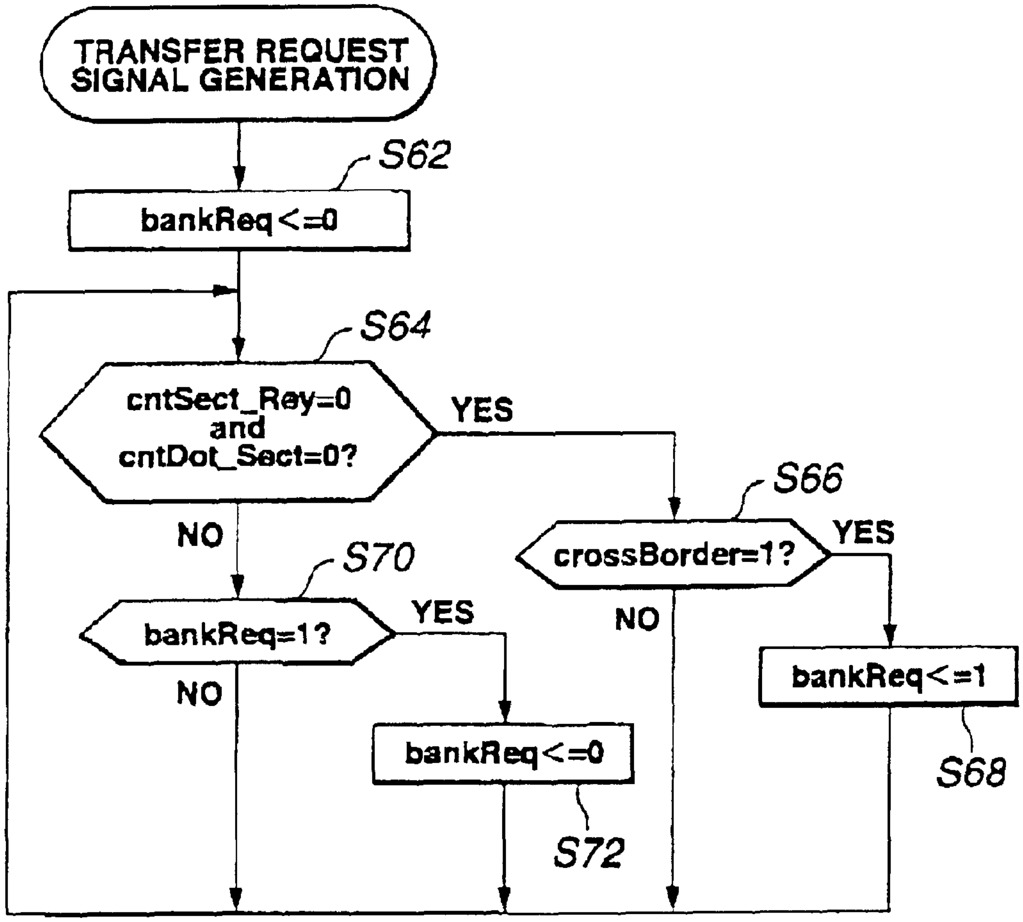
FIG. 12 is a flowchart illustrating the generation of the data transfer request signal.

FIG. 12 is a flowchart for explaining the generation of a data transmission request signal of the memory controller 405. As described above, when the memory controller 405 finishes reading the data from bank A of the memory 404, it transmits the data transfer request signal to the drawing point coordinate generation unit 401. In this routine, the drawing point coordinate generation unit 401 generates SizeBank worth of coordinates, and the drawing data generation unit 402 transmits data of the respective drawing points to bank A. Similar processing is performed when data of bank B has been read.

Data transfer request processing foremost sets "0" to the data transfer request flag bankReq, and resets it (S62). Next, whether the current readout position is at a prescribed position; that is, the sector top position of the top sector of the track in which the sector within the track is number 0 and the dot number within the sector is also number 0 is determined by checking whether the variable cntSect_Rev is "0" and the variable cntDot_Sect is "0" (S64).

When it is in the sector top position of this track (S64; Yes), whether the memory controller 405 accessed the final address of bank A or bank B of the memory 404 is determined with the value of the variable crossBorder described below (S66). When the variable crossBorder value is not "1" and the final address has not yet been accessed (S66; No), the routine returns to step S64 without generating the data transfer request, and repeats the processing. When the final address has been accessed (S66; Yes), "1" is set to the data transfer request flag bankReq, the data transfer request signal is sent to the drawing point coordinate generation unit 401 (S68), and the routine returns to step S64 and repeats the processing.

Meanwhile, when the current readout position is not the sector top position of the track (S64; No), whether the data transfer request has been generated is determined by checking whether the variable bankReq is "1" (S70). When the data transfer request has not been generated (S70; No), the routine returns to step S64 and repeats the processing. When the data transfer request has been generated (S70; Yes), "0" is set to the variable bankreq, the variable bankreq is reset (S72), and the routine returns to step S64. The variable bankreq is reset and the data transfer request will extinguish (S62). One loop in the respective processing step 64 to step S72 is in synchronization with the clock of the oscillator 407. The data transfer request signal bankReq is transferred in synchronization with the rotation of the turntable in order to prevent the overwriting of necessary data on the memory. Reuse of the drawing data may be repeated within one full circle.

Figure 13:
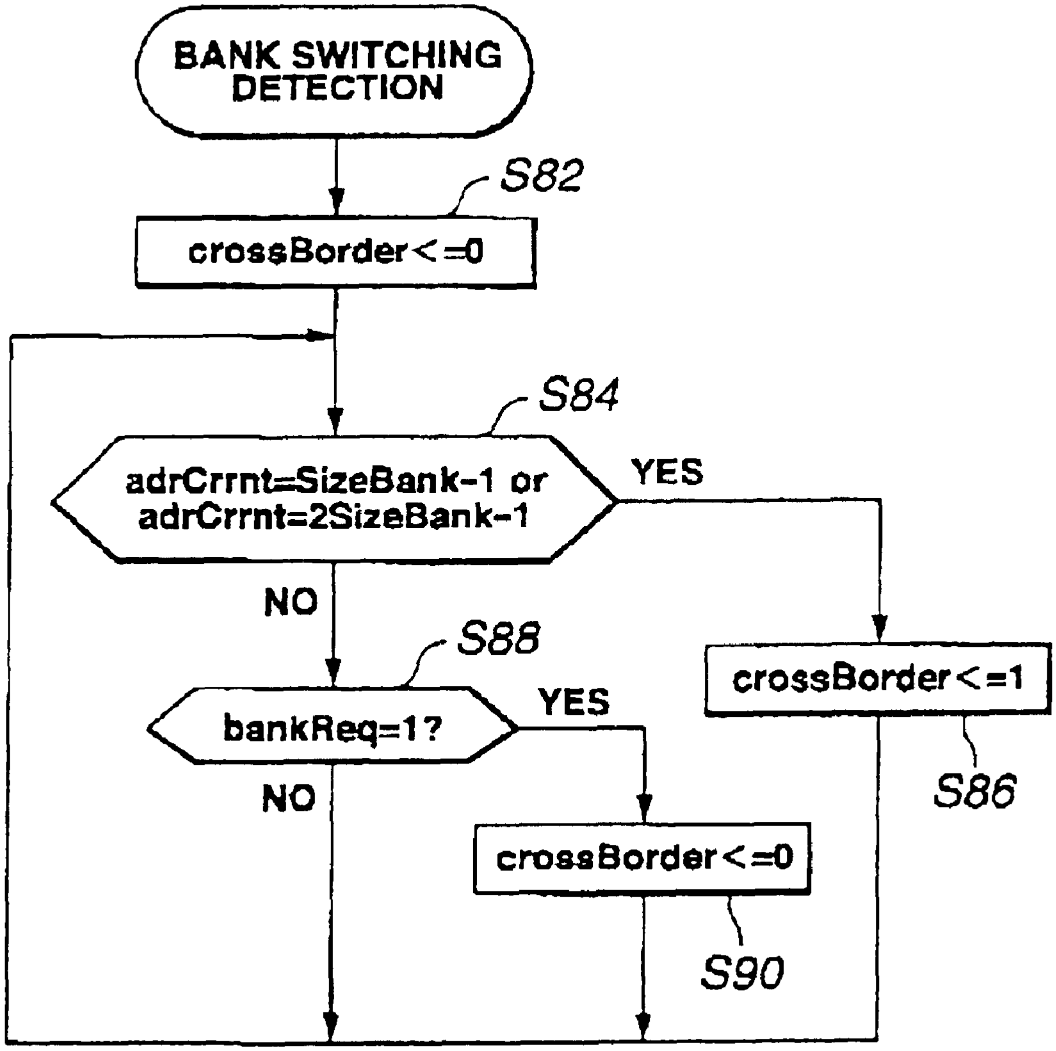
FIG. 13 is a flowchart illustrating the readout bank switching inside the memory.

FIG. 13 is a flowchart for explaining the variable crossBorder which detects the bank switching. The variable crossBorder becomes "1" when the memory controller accesses the final address of bank A or B, and becomes "0" after the output of the variable bankReq signal.

Foremost, in the detection processing of the bank switching, the memory controller resets the variable crossBorder (S82). Whether the current readout address of the memory 404 is the maximum address of bank A or the maximum address of bank B is determined by checking whether the variable adrCrrnt value indicating the readout address is equivalent to SizeBank−1 or 2×SizeBank−1 (S84). When the readout address of the memory 404 is the final address of bank A or bank B (S84; Yes), readout for one of the banks is ended, or the variable crossBorder indicating that the readout position is at the memory bank boundary is set to "1" (S86), and the routine returns to step S64 and repeats the processing.

When the readout address of the memory 404 is not the final address of bank A or bank B (S84; No), whether the data transfer request has been generated is determined by checking whether the variable bankReq is "1" (S88). When the data transfer request has not been generated (S88; No), the routine returns to step S84 and repeats the processing. When the data transfer request has been generated (S88; Yes), the variable crossBorder is set to "0", the variable crossBorder is reset (S90), and the routine returns to step S84. The variable crossBorder is reset and the bank switching signal is extinguished (S62). One loop of the respective processing step S84 to step S90 is in synchronization with the clock of the oscillator 407. Thus, when the readout address passes through bank Boundary, the variable crossBorder becomes "1", the variable bankreq becomes "1", and is reset to "0" when the data transfer request signal is generated.

The repetition of this series of operations will reduce in half the processing necessary for generating the drawing point data in comparison to conventional processing, and high-speed drawing is thereby enabled.

Figure 14:
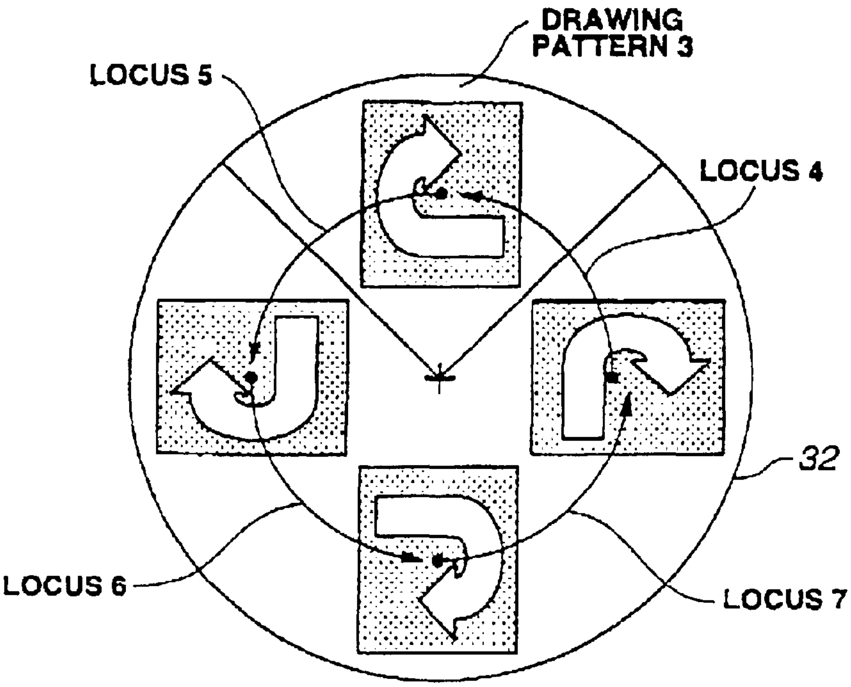
FIG. 14 is a diagram illustrating a drawing example of the second pattern.

FIG. 14 is an explanatory diagram for explaining another embodiment. In this illustration, shown is an example of drawing four patterns with one pattern data of the J-shaped arrow. Four patterns are formed by drawing loci 1, 2, 3 and 4 having mutually equivalent lengths, which form the locus of one track, with the same drawing data.

Figure 15:
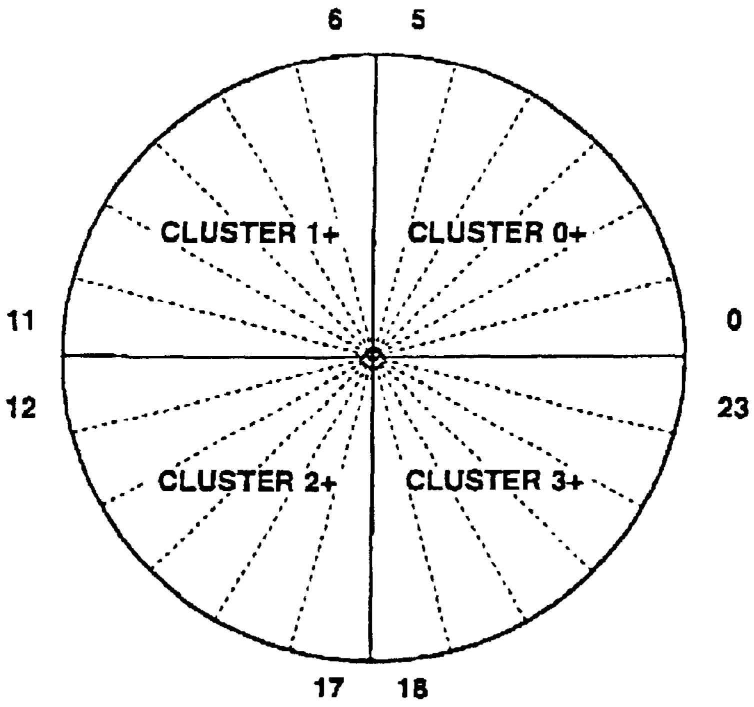
FIG. 15 is a diagram illustrating a structural example of the sector and cluster upon drawing the second pattern.

FIG. 15 depicts a layout of the cluster in such a case. The drawing area is divided into 24 sectors, and sectors 0 to 5 correspond to cluster0+, sectors 6 to 11 correspond to cluster1+, sectors 12 to 17 correspond to cluster2+, and sectors 18 to 23 correspond to cluster3+. Here, the "+" of the cluster represents that the address designation will be read out in the increased (forward) direction.

In this embodiment, the subroutine contents of the processing illustrated in FIG. 6 are changed as illustrated in FIG. 16 to FIG. 20.

Figure 16:
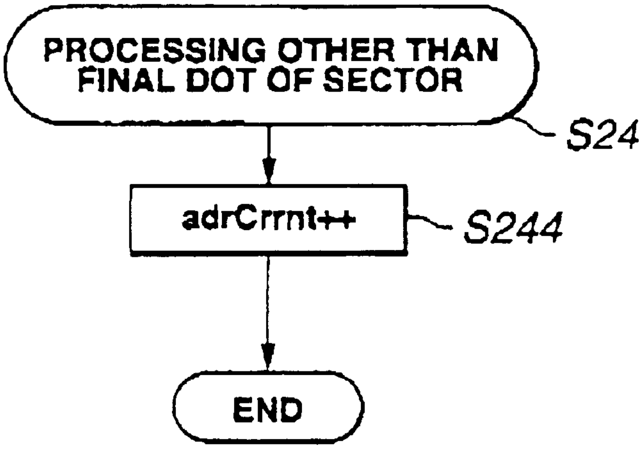
FIG. 16 is a flowchart illustrating the processing other than the final dot of the sector in the drawing of the second pattern.
Figure 17:
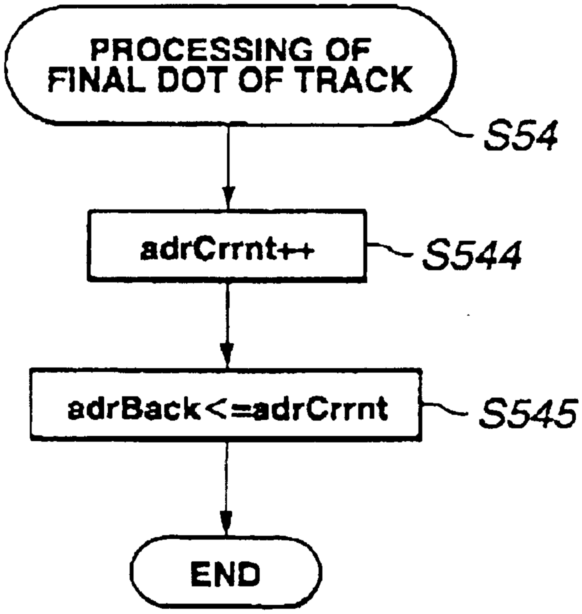
FIG. 17 is a flowchart illustrating the processing of the final dot of the track in the drawing of the second pattern.
Figure 18:
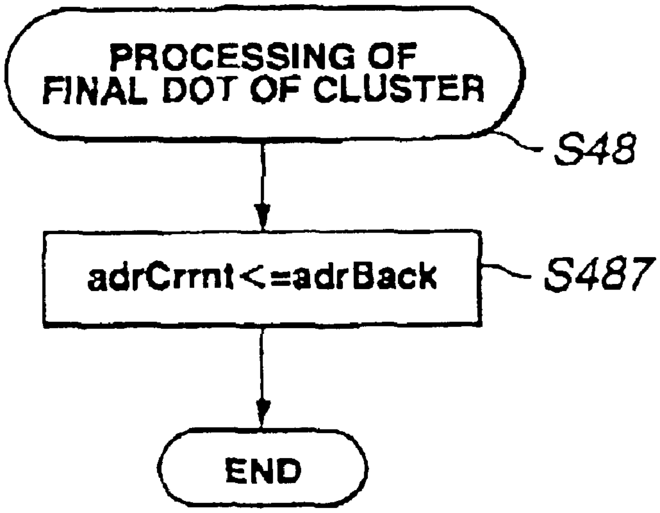
FIG. 18 is a flowchart illustrating the processing of the final dot of the cluster in the drawing of the second pattern.
Figure 19:
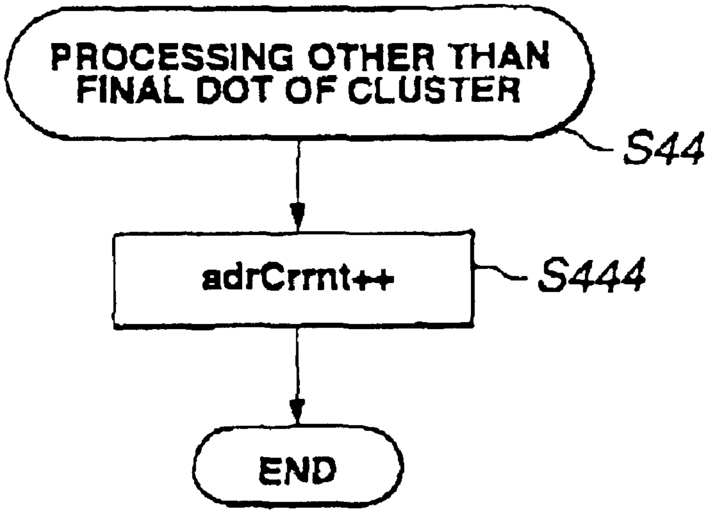
FIG. 19 is a flowchart illustrating the processing other than the final dot of the cluster in the drawing of the second pattern.

In other words, as shown in FIG. 16, with the processing other than the final dot of the sector (S24), the memory controller 405 increases the address for accessing the memory 404 by "1" (S244), and the routine returns to step S14. Moreover, as shown in FIG. 17, with the processing of the final dot of the track (S54), the memory controller 405 increases the address for accessing the memory 404 by "1" (S544). Further, the value of the current address adrCrrnt is set to the variable adrBack indicating the memory address corresponding to the top dot of the cluster (S545), and the routine returns to step S14. As shown in FIG. 18, with the processing of the final dot of the cluster (S48), the memory controller 405 sets the address for accessing the memory 404 to adrBack, increases this by "1" (S244), and the routine returns to step S14. As shown in FIG. 19, with the processing other than the final dot of the cluster (S44), the memory controller 405 increases the address for accessing the memory 404 by "1" (S244), and the routine returns to step S14.

In the second embodiment, in comparison to the case where the drawing point coordinate generation unit 401 and drawing data generation unit 402 generate the entire drawing point data, the data processing required will reduced by approximately 75% since the same data is used four times.

Therefore, according to the embodiments of the present invention, because data of the basic pattern is repeatedly used, or the dummy data is used to draw the overall pattern, the operational load required for data conversion is greatly reduced in comparison with methods that convert the overall pattern data.

As described above, according to the pattern drawing device of the present invention, since a pattern is drawn by repeatedly using the data converted in the r-θ coordinate system, the operational processing load of data conversion is reduced, and faster drawing becomes possible without requiring additional CPU performance. The resolution may also be improved thereby.

This application claims priority from Japanese Patent Application No. 2001-217152, filed Jul. 17, 2001, the entire contents of which are herein incorporated by reference.

What is claimed is:

1. A pattern drawing device for forming a plurality of tracks disposed concentrically on a substrate and drawing a two-dimensional pattern thereby, comprising:

pattern generation means for repeatedly arranging in positive or reverse a basic pixel sequence to be the basis for each track at least in two places on one track and, by performing this to a plurality of consecutive tracks, forming said two-dimensional pattern;

modulation means for modulating a drawing beam scanning said substrate with said pixel sequence data; and beam position setting means for synchronizing with said pixel sequence data and setting the scanning position on said substrate of said drawing beam.

2. A pattern drawing device according to claim 1, wherein said substrate is demarcated with a plurality of sector areas divided in the circumferential direction and a cluster area combined with one or a plurality of consecutive said sector areas, and has a plurality of said cluster areas; and said pattern generation means outputs when the drawing beam scans said basic pixel sequence on the track of said cluster area.

3. A pattern drawing device according to claim 1, wherein said pattern generation means arranges a simulated pixel sequence which does not form a pattern between said basic pixel sequence.

4. A pattern drawing device according to claim 2, wherein said pattern generation means arranges a simulated pixel sequence which does not form a pattern on the track of the sector area other than said cluster area.

5. A pattern drawing device according to claim 1, wherein said track is a locus obtained by rotationally scanning the substrate pursuant to a drawing beam modulated with said pixel sequence data.

6. A manufacturing method of a pattern drawing body prepared by forming a plurality of tracks disposed concentrically on a substrate and drawing a two-dimensional pattern;

wherein said two-dimensional pattern is formed by repeatedly arranging in positive or reverse a basic pixel sequence to be the basis for each track at least in two places on one track and, by performing this to a plurality of consecutive tracks, forming said two-dimensional pattern.

7. A manufacturing method of a pattern drawing body according to claim 6, comprising the steps of:

demarcating said substrate with a plurality of sector areas divided in the circumferential direction and a cluster area combined with one or a plurality of consecutive said sector areas;

including a plurality of said cluster areas in said substrate; and arranging said basic pixel sequence on the track of said cluster area.

8. A manufacturing method of a pattern drawing body according to claim 7, wherein arranged is a simulated pixel sequence which does not form a pattern on the track of the sector area other than said cluster area.

9. A method of forming a two dimensional pattern on a substrate comprising:

obtaining a data set corresponding to the two dimensional pattern;

using the data set to generate a plurality of n drawing data sets wherein each drawing data set comprises a series of pixel addresses in a polar coordinate format corresponding to a first circumferential portion of a single track of n concentric tracks;

preparing a substrate having a light sensitive layer on an upper surface of the substrate;

placing the substrate on a stage, the stage being configured for both rotational and linear motion;

providing a light energy beam directed to the upper surface of the substrate and positioned along a diameter of the substrate;

sequentially exposing the first circumferential portion and a second circumferential portion of each of the n concentric tracks by sequentially using each of the n drawing data sets to synchronize the motion of the stage and modulate an intensity of the light energy beam reaching the upper surface of the substrate, wherein the exposed n first concentric portions comprise a first drawing pattern in a first cluster and the exposed n second concentric portions comprise a second drawing pattern in a second cluster; and processing the exposed light sensitive layer in the first and second clusters to produce the two dimensional pattern.

10. A method of forming a two dimensional pattern according to claim 9 wherein:

the first cluster comprises a portion the upper surface of the substrate corresponding to a first 90° arc about a center of the substrate, the first drawing pattern having been generated by reading each of the n drawing data sets in a forward order;

the second cluster comprises a portion of the upper surface of the substrate corresponding to a second 90° arc about the center of the substrate, the second arc adjacent to but overlapping no portion of the first arc, the second drawing pattern having been generated by reading each of the n drawing data sets in a reverse order.

11. A method of forming a two dimensional pattern according to claim 9 further comprising:

sequentially exposing a third circumferential portion of each of the n tracks in a third cluster and exposing a fourth circumferential portion of each of the n tracks in a fourth cluster by sequentially using each of the n drawing data sets to synchronize the motion of the stage and modulate the intensity of the light energy beam reaching the upper surface of the substrate to expose a third drawing pattern in the third cluster and a fourth drawing pattern in the fourth cluster; and processing the exposed light sensitive layer in the first, second, third and fourth clusters to produce the two dimensional pattern.

12. A method of forming a two dimensional pattern according to claim 11, wherein:

each of the first, second, third and fourth clusters substantially comprises a separate quadrant of the upper surface of the substrate arranged about a center point of the substrate and each of the first, second, third, and fourth drawing patterns are substantially identical and arranged so that an orientation of each of the drawing patterns is offset 90° from each of two adjacent drawing patterns.

13. A pattern drawing device for forming a plurality of concentric tracks disposed on a substrate to produce a two-dimensional pattern comprising:

a pattern generator for arranging a basic pixel sequence to generate, in sequence, a forward drawing data set or a reverse drawing data set from pattern data corresponding to a first angular portion of each track of n concentric tracks;

a drawing beam directed to an upper surface of the substrate;

a drawing beam modulator for modulating an intensity of the drawing beam reaching the upper surface of the substrate as the drawing beam is scanned across the substrate; and a drawing beam positioner for controlling the scanning of the drawing beam across the substrate;

wherein the drawing beam modulator and the drawing beam positioner are synchronized by the pattern generator to expose a first angular portion of a scanned track on the substrate using a forward drawing data set corresponding to the scanned track; and to expose a second angular portion of the scanned track substrate using a drawing data set selected from a group consisting of the forward drawing data set and a reverse drawing data set corresponding to the scanned track.

14. A pattern drawing device according to claim 13, wherein;

the substrate is segregated into a plurality of cluster areas comprising equal angular sections of the substrate; and wherein each of the cluster areas is further segregated into an equal number of sector areas comprising equal angular sections of each cluster area; and further wherein the pattern generator synchronizes the drawing beam modulator and the beam positioner to expose selected clusters, each selected cluster being exposed by sequentially scanning the substrate according to n drawing data sets selected from a group consisting of n forward drawing data sets and n reverse drawing data sets.

15. A pattern drawing device according to claim 13, wherein each of the concentric tracks comprises a locus obtained by rotating the substrate with the drawing beam positioned at a point along a diameter of the substrate determined by the pattern generator according to the basic pixel sequence.

16. A pattern drawing device according to claim 13 wherein the drawing beam comprises a laser beam and the drawing beam modulator comprises an acousto-optical modulator.

* * * * *

UNITED STATES PATENT AND TRADEMARK OFFICE

CERTIFICATE OF CORRECTION

PATENT NO. : 6,872,498 B2 
DATED : March 29, 2005
INVENTOR(S) : Kimio Nagasaka, Akira Miyamae and Eiichi Fujii It is certified that error appears in the above-identified patent and that said Letters Patent is hereby corrected as shown below:

<u>Title page,</u>
Item [75], Inventors, residences “Suwa (JP)” should be:
-- Nagasaka, Nirasaki-shi (JP);
Miyamae, Fujimi-machi (JP);
Fujii, Fujimi-machi (JP) --.

<u>Column 1,</u>
Line 16, before “semiconductor” insert -- of --.

<u>Column 4,</u>
Line 57, “$(r_1, \theta 1)$” should be -- $(r_i, \theta_i)$ --.
Line 62, “$(r_1, \theta_1)$” should be -- $(r_i, \theta_i)$ --.
Line 63, “$(x_i, y_1)$” should be -- $(x_i, y_i)$ --.
Line 65, “$(x_1, y_1)$” should be -- $(x_i, y_i)$ --.
Line 66, “$x_1=r_1\cos\theta_1$” should be -- $x_i=r_i\cos\theta_i$ --.

<u>Column 5,</u>
Line 67, “$y_1=r_1\sin\theta_1$” should be -- $y_i=r_i\sin\theta_i$ --.

Signed and Sealed this

Twenty-fifth Day of October, 2005

JON W. DUDAS
*Director of the United States Patent and Trademark Office*